United States Patent [19]
Shiau et al.

[11] Patent Number: 6,021,083
[45] Date of Patent: Feb. 1, 2000

[54] BLOCK DECODED WORDLINE DRIVER WITH POSITIVE AND NEGATIVE VOLTAGE MODES

[75] Inventors: Tzeng-Huei Shiau, Hsin-Chu; Yu-Shen Lin, Taipei, both of Taiwan; Ray-Lin Wan, Fremont, Calif.

[73] Assignee: Macronix International Co., Ltd., Hsinchu, Taiwan

[21] Appl. No.: 09/051,005

[22] PCT Filed: Dec. 5, 1997

[86] PCT No.: PCT/US97/22102

§ 371 Date: Mar. 30, 1998

§ 102(e) Date: Mar. 30, 1998

[87] PCT Pub. No.: WO99/30326

PCT Pub. Date: Jun. 17, 1999

[51] Int. Cl.[7] .................................................. G11C 13/00
[52] U.S. Cl. ........................ 365/230.01; 365/189.01; 365/185.33; 365/218
[58] Field of Search ..................... 365/189.01, 230.01, 365/226, 218, 185.33

[56] References Cited

U.S. PATENT DOCUMENTS

| | | |
|---|---|---|
| 4,761,764 | 8/1988 | Watanabe ............................. 365/185.33 |
| 4,823,318 | 4/1989 | D'Arrigo et al. . |
| 4,875,188 | 10/1989 | Jungroth . |
| 4,888,734 | 12/1989 | Lee et al. . |
| 4,888,735 | 12/1989 | Lee et al. . |
| 5,050,125 | 9/1991 | Momodomi et al. . |
| 5,065,364 | 11/1991 | Atwood et al. . |
| 5,077,691 | 12/1991 | Haddad et al. . |
| 5,091,888 | 2/1992 | Akaogi . |
| 5,095,461 | 3/1992 | Miyakawa et al. . |
| 5,117,394 | 5/1992 | Amin et al. . |
| 5,136,541 | 8/1992 | Arakawa . |
| 5,142,496 | 8/1992 | Van Buskirk . |
| 5,163,021 | 11/1992 | Mehrotra et al. . |

(List continued on next page.)

FOREIGN PATENT DOCUMENTS

0525678 A2 2/1993 European Pat. Off. .
0559995 A1 9/1993 European Pat. Off. .

OTHER PUBLICATIONS

Venkatesh, B., et al., "A 55ns 0.35μm 5v–only 16M Flash Memory with Deep–Power–Down", IEEE International Solid–State Circuits Conference, ISSCC96/Session 2/Flash Memory/Paper TP 2.7, pp. 44–45, (1996).

*Primary Examiner*—Terrell W. Fears
*Attorney, Agent, or Firm*—Mark A. Haynes; Haynes & Beffel LLP

[57] ABSTRACT

The negative supply voltage used by the drivers during sector or chip level erase operations is decoded separately from the decoding of the inputs of the individual wordline drivers in a compact wordline driver and decoder system. An integrated circuit memory comprising an array of memory cells arranged in a plurality of segments, a set of wordlines is coupled to the memory cells in the array, and wordline driver circuitry coupled to the set of wordlines is provided. The wordline driver circuitry includes a first supply voltage source, a second supply voltage source, and a set of wordline drivers. The wordline drivers are coupled to the first and second supply voltage sources, and selectively drive wordlines in the set of wordlines with a wordline voltage from either the first supply voltage source or the second supply voltage source in response to address signals which identify the respective drivers. The second supply voltage source includes a set of supply voltage selectors. Each supply voltage selector in the set is coupled with a subset of the set of drivers. The subset of drivers is coupled with a respective segment in the array. The supply voltage selectors select a negative erase supply voltage or an erase inhibit supply voltage during an erase mode in response to address signals identifying the respective segments. The selected negative erase supply voltage or erase inhibit supply voltage is applied to the subsets of the set of drivers which are coupled to the respective segment on a segment by segment basis.

23 Claims, 7 Drawing Sheets

U.S. PATENT DOCUMENTS

| | | |
|---|---|---|
| 5,197,034 | 3/1993 | Fandrich et al. . |
| 5,212,663 | 5/1993 | Leong . |
| 5,222,040 | 6/1993 | Challa . |
| 5,235,544 | 8/1993 | Caywood . |
| 5,253,200 | 10/1993 | Arakawa . |
| 5,253,202 | 10/1993 | Bronner et al. . |
| 5,257,238 | 10/1993 | Lee et al. . |
| 5,282,170 | 1/1994 | Van Buskirk et al. . |
| 5,287,536 | 2/1994 | Schreck et al. . |
| 5,291,446 | 3/1994 | Van Buskirk et al. . |
| 5,297,096 | 3/1994 | Terada et al. . |
| 5,297,148 | 3/1994 | Harari et al. . |
| 5,311,480 | 5/1994 | Schreck . |
| 5,319,604 | 6/1994 | Imondi et al. . |
| 5,321,653 | 6/1994 | Suh et al. . |
| 5,329,168 | 7/1994 | Sugibayashi et al. . |
| 5,371,705 | 12/1994 | Nakayama et al. . |
| 5,399,891 | 3/1995 | Yiu et al. . |
| 5,412,238 | 5/1995 | Chang . |
| 5,414,664 | 5/1995 | Lin et al. . |
| 5,463,586 | 10/1995 | Chao et al. . |
| 5,513,147 | 4/1996 | Prickett, Jr. . |
| 5,521,867 | 5/1996 | Chen et al. . |
| 5,528,546 | 6/1996 | Chao et al. . |
| 5,532,960 | 7/1996 | Lin et al. . |
| 5,546,340 | 8/1996 | Hu et al. . |
| 5,553,295 | 9/1996 | Pantelakis et al. . |
| 5,563,827 | 10/1996 | Lee et al. . |
| 5,581,509 | 12/1996 | Golla et al. . |
| 5,587,947 | 12/1996 | Chang et al. . |

BLOCK DECODED WORDLINE DRIVER WITH POSITIVE AND NEGATIVE VOLTAGE MODES

BACKGROUND OF THE INVENTION

1. Field of the Invention

The present invention relates to wordline drivers used in memory arrays which are capable of driving both positive and negative voltages on the wordlines; and more particularly to floating gate memory devices which apply a negative voltage to wordlines during an erase mode, and a positive voltage to individual wordlines during a read mode and a program mode.

2. Description of Related Art

In nonvolatile semiconductor memory devices based on floating gate memory cells, such as those known as flash EEPROM, positive and negative voltages are used to read and write data into the nonvolatile memory array. The writing of data into the nonvolatile memory array for floating gate devices involves processes known as the program and erase modes. The erase mode involves setting an entire array, or at least a sector of an array, to a single state, in which either all of the cells in the array (or sector) have a low threshold or all of the cells in the array (or sector) have a high threshold. Whether the erased state is a high threshold state, in which the floating gate of the cell is charged or a low threshold state in which the floating gate is discharged, depends on the particular implementation of the flash memory. The programming mode involves charging or discharging the floating gate of individually addressed cells in the array to establish the opposite threshold level with respect to the erased state.

It is well known that in order to discharge the floating gate, it is advantageous to apply a negative voltage to the wordline for the cell to be discharged. This assists in driving electrons out of the floating gate into the source, drain or channel regions of the cell, which are typically biased to a positive level to attract the electrons. However, circuitry for applying a negative voltage to a wordline presents some difficulties.

Wordline drivers must be capable of driving a positive voltage during a normal read mode for the device to selected wordlines in response to decoded addresses. It has proved difficult in the prior art to provide a wordline driver with the simple circuitry that can also apply a negative voltage to selected the wordlines. Prior systems for applying negative voltages to the wordlines have overridden the decoding function which drives the wordline driver, making it impossible to selectively apply negative voltages to individual wordlines. See, for instance, European Patent Application No. 92112727.0 entitled NONVOLATILE SEMICONDUCTOR MEMORY DEVICE HAVING ROW DECODER, invented by Atsumi, et al. (Publication No. 0 525 678 A2); and European Patent Application No. 92830115.9, entitled DECODER CIRCUIT CAPABLE OF TRANSFERRING POSITIVE AND NEGATIVE VOLTAGES, invented by Gastaldi (Publication No. 0 559 995 A1). In both of these European patent applications, a wordline driver is disclosed which provides a positive voltage to selected wordlines for normal read mode operations, but overrides the selecting function of the decoder during an erasing mode to apply a negative voltage to all wordlines. Because the decoding function is overridden, negative wordline voltages are applied to circuitry for all cells, even during a sector erase. This results in disturbance of cells that are not being erased.

In alternative systems, separate drivers, one for positive voltage and one for negative voltage, at opposite ends of the wordline and each coupled to the decoding circuit have been used. For instance, Arakawa, U.S. Pat. No. 5,136,541, entitled PROGRAMMABLE READ ONLY MEMORY USING STACKED-GATE CELL ERASABLE BY HOLE INJECTION, and Arakawa, U.S. Pat. No. 5,253,200 entitled ELECTRICALLY ERASABLE AND PROGRAMMABLE READ ONLY MEMORY USING STACKED-GATE CELL, describe a system for driving a wordline with a positive and negative voltage based on the use of separate drivers. (See, for instance, FIG. 3 of Arakawa's U.S. Pat. No. 5,136,541).

U.S. Pat. No. 5,331,480 entitled METHOD AND APPARATUS FOR EPROM NEGATIVE VOLTAGE WORDLINE DECODING, invented by Schreck, describes a system in which each wordline has an independent negative voltage charge pump in order to provide for decoding in a negative voltage and positive voltage state. However, when a single negative voltage source is coupled to a plurality of wordline drivers, all wordlines are driven negative at the same time. Thus, the Schreck circuit is impractical in large memory systems because of the expense and complexity in repeating large numbers of charge pumps on a single chip.

Venkatesh, et. al., "A55 ns 6.35 μm 5V-only 16M Flash Memory with Deep-Power-Down," 1996, IEEE International Solid-State Circuits Conference, Paper JP 2.7, pp. 44–45; discloses a wordline driver for positive and negative voltages (FIG. 1($a$)), and mentions sector erase. However, there is no discussion of decoding of the wordlines during erase. See also U.S. Pat. No. 5,521,867 (FIG. 4), entitled ADJUSTABLE THRESHOLD VOLTAGE CONVERSION CIRCUIT, invented by Chen, et. al.

It is desirable to provide a simplified wordline driver capable of selectively applying positive or negative voltages to a wordline during a program mode in a floating gate device, or otherwise to the wordline in a memory array. It is further desirable that the driver be small in layout, and support sector level erase operations in which the wordlines of memory cells in the block to be erased are driven with negative voltages.

SUMMARY OF INVENTION

The present invention provides a compact wordline driver and decoder system in which the negative supply voltage used by the wordline drivers during sector or chip level erase operations is decoded separately from the decoding of inputs to the individual wordline drivers. This allows for use of wordline drivers having a small layout, yet maintaining the ability to decode the negative voltage driving capability at the sector level. Also, this design minimizes the number of so called triple well transistors which are required for implementation of high negative voltage circuits on an integrated circuit of this nature. Accordingly, using the wordline driver of the present invention, an integrated circuit memory is provided with compact array layout and therefore reduced cost.

Thus, the present invention can be characterized as an integrated circuit memory comprising an array of memory cells arranged in a plurality of segments. A set of wordlines is coupled to the memory cells in the array. Wordline driver circuitry is coupled to the set of wordlines. The wordline driver circuitry includes a first supply voltage source, a second supply voltage source, and a set of wordline drivers. The wordline drivers are coupled to the first and second supply voltage sources, and selectively drive wordlines in the set of wordlines with a wordline voltage from either the first supply voltage source or the second supply voltage source in response to address signals which identify the respective drivers. The individual drivers are connected to sets including one or more wordlines. The second supply voltage source includes a set of supply voltage selectors. Each supply voltage selector in the set is coupled with a subset of the set of drivers. The subset of drivers is coupled with a respective segment in the array. The supply voltage selectors select a negative erase supply voltage or an erase inhibit supply voltage during an erase mode in response to address signals identifying the respective segments. The selected negative erase supply voltage or erase inhibit supply voltage is applied to the subsets of the set of drivers which are coupled to the respective segment on a segment by segment basis. This enables erase operations with a compact wordline driver design at a segment level, where a segment is a block or sector of the array that is coupled to more than one wordline driver, such as 16 wordline drivers.

According to one aspect of the invention, the wordline circuitry includes logic that causes the drivers to select the second supply voltage source during the erase mode for all wordlines in the set of wordlines. Such logic in one embodiment overrides the address signals identifying the respective drivers during the erase mode, in the logic which supplies the inputs to the drivers.

According to another aspect of the invention, the wordline drivers comprise an inverter having an input driven in response to address signals identifying the corresponding driver, a first supply terminal coupled to the first supply voltage source, a second supply terminal coupled to the second supply voltage source, and an output coupled to one or more wordlines in the set of wordlines. Also, a feedback circuit is included that is coupled between the output and the input of the inverter. In one embodiment, the inverter comprises a p-channel MOS transistor in series with a triple well n-channel MOS transistor. The source of the n-channel MOS transistor is coupled to the second supply voltage source, and supports transferring of the high negative voltage to the wordline. The source of the p-channel MOS transistor is coupled to the first supply voltage source, and supports applying positive voltages to the wordline during the read and program modes. In another aspect, the feedback circuit comprises a p-channel MOS transistor having its source coupled to the first supply terminal, its gate coupled to the output of the driver, and its drain coupled to the input of the driver.

According to another aspect of the invention, the present invention comprises a flash memory device comprising an array of floating gate memory cells. Control logic on the device establishes a read mode, a program mode and an erase mode. Wordline driver circuitry as described above is included on the device. The wordline driver circuitry includes segment decoder logic that is coupled to the drivers in the set of drivers. The segment decoder logic causes the inputs of the drivers to be set in response to address signals identifying the drivers during the read mode so that they supply a read supply voltage to addressed wordlines. In the erase mode the decoder logic causes the inputs to the drivers to be supplied independent of the address signals, and the supply voltage selectors select a negative erase supply voltage or the erase inhibit voltage in response to address signals identifying the respective segments.

In a preferred floating gate memory architecture, the negative erase supply voltage has a value in the range of −5 to −10 volts such as about −8 volts, while the erase inhibit supply voltage has a value in the range of +3 volts to −3 volts, and preferably about ground potential. The cells in the array are otherwise biased in this condition to induce Fowler Nordheim tunneling in the floating gate memory cells in the segment being erased.

Alternatively, the present invention can be characterized as a wordline driver in a set of wordline drivers. The wordline driver according to this aspect comprises a first supply voltage source and a second supply voltage source. The second supply voltage source includes a supply voltage selector which selects a negative voltage or an inhibit supply voltage as a second supply voltage in response to a supply select signal. Decode logic, responsive to address signals identifying the driver and a mode signal, operates to supply a decode logic output in response to the address signals when the mode signal is in a first state, and without response to the address signals when the mode signal is in a second state. Supply select logic is responsive to address signals identifying a plurality of wordline drivers in the set of wordlines, such as a plurality of wordline drivers corresponding to a segment of the memory to be erased. The supply select logic supplies the supply select signal without response to the address signals when the mode signal is in a first state, and in response to the address signals when the mode signal is in the second state. The driver further includes an inverter having an input coupled to the decode logic output, a first supply terminal coupled to the first supply voltage source, a second supply terminal coupled to the second supply voltage source to receive the second supply voltage, and an output coupled to a wordline. A feedback circuit is coupled between the output and the input of the inverter. In preferred aspects, the inverter and feedback circuit are implemented as discussed above.

Accordingly, the present invention provides a set of wordline drivers for a memory organized into a plurality of segments. The wordline drivers in a given segment share the same second supply voltage source which is capable of applying a negative voltage. Thus each segment has its own second supply voltage source. Under this arrangement, the wordline drivers within one segment experience either a negative voltage on the second supply terminal or a inhibit voltage such as ground on the second supply terminal. Under this approach, a simplified wordline driver and compact overall array architecture are achieved.

Accordingly, the present invention provides a compact decoded wordline driver which can be used in a flash EEPROM device for providing positive and negative decode modes. This system is small, operates with great efficiency, and eliminates complex circuitry of prior art systems.

Other aspects and advantages of the present invention can be seen upon review of the figures, the detailed description and the claims which follow.

DETAILED DESCRIPTION

A detailed description of preferred embodiments of the present invention is provided with reference to FIGS. 1–6.

Figure 1:
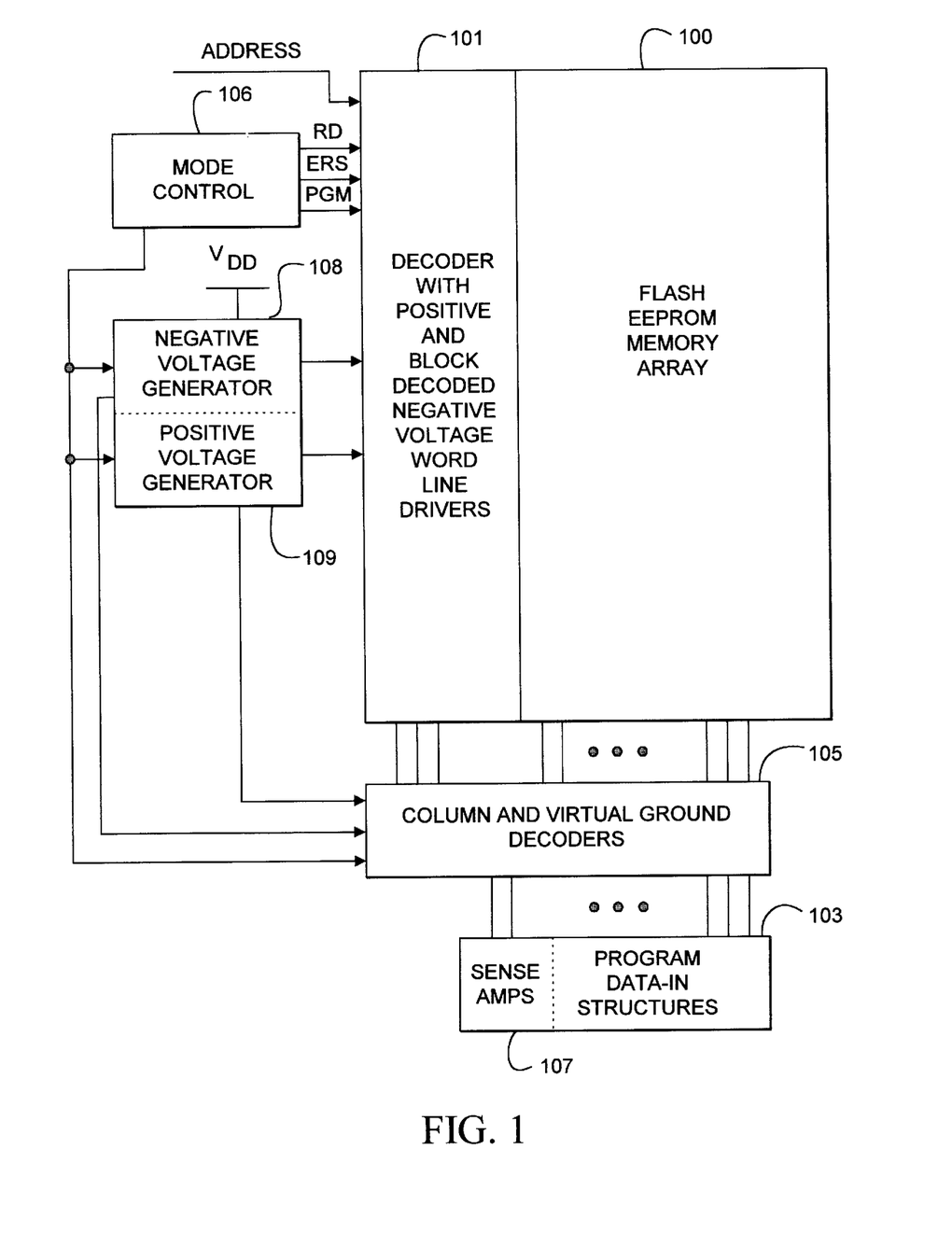
FIG. 1 is a schematic diagram of a Flash EEPROM device including a decoder with positive and block decoded negative voltage wordline drivers according to the present invention.
Figure 2:
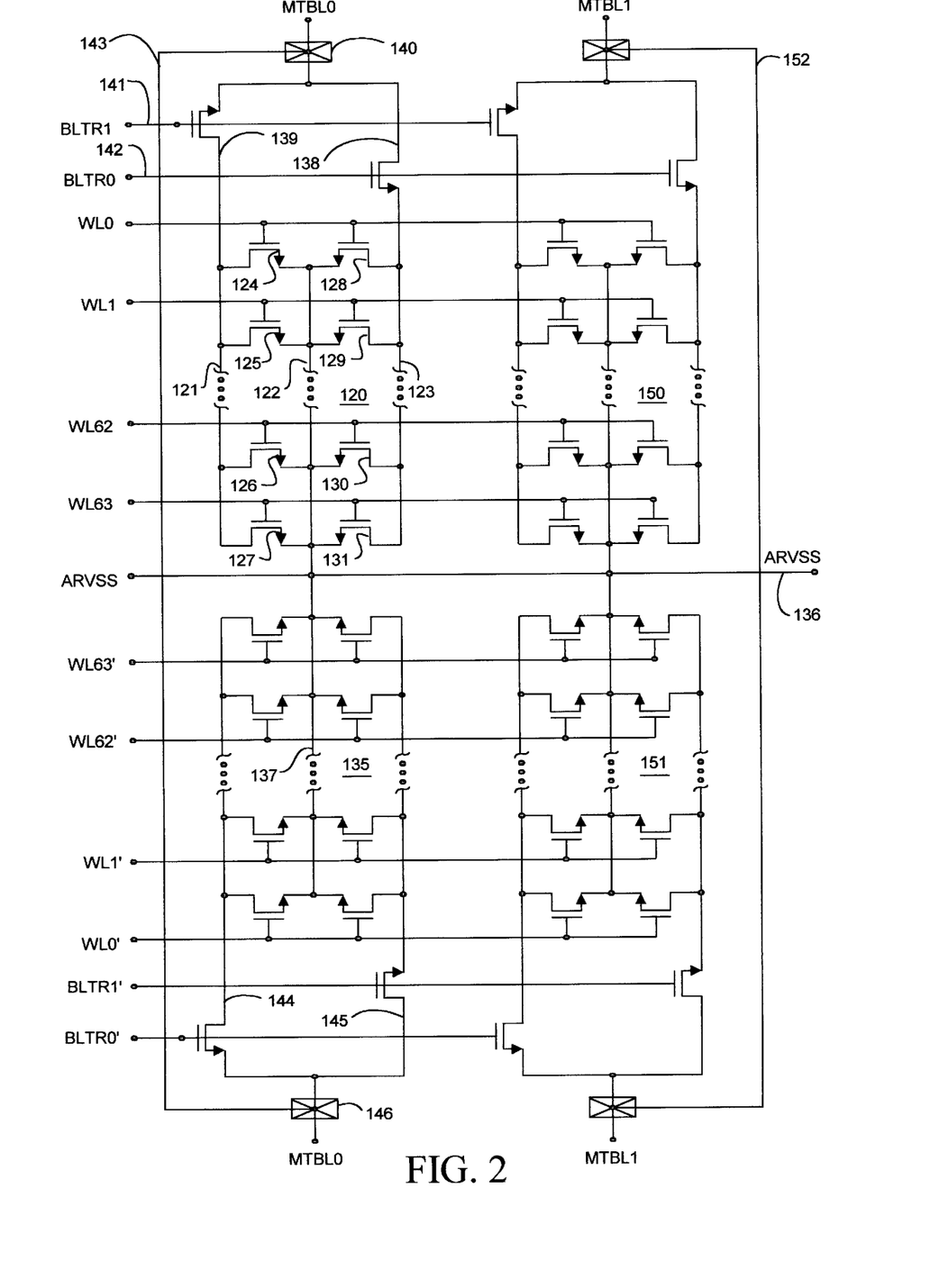
FIG. 2 is an illustration of a Flash EEPROM array for use in the device of FIG. 1.

In FIG. 1, a flash device is shown, which includes a floating gate transistor array 100 having a plurality of sectors capable of independently being erased, which might be implemented as shown in FIG. 2. Coupled to the array are a decoder 101, which has positive and block decoded negative voltage wordline drivers. A mode control circuit 106 is coupled to the negative voltage generator 108, positive voltage generator 109, and column and virtual ground decoders 105 to provide a read RD, a program PGM, and an erase ERS mode for the Flash device. A negative voltage generator 108 and a positive voltage generator 109 are also coupled with the decoder.

Column and virtual ground decoders 105 are coupled to the bitlines in the array as shown, and to the negative voltage generator 108 and positive voltage generator 109. Finally, sense amps 107 and program data-in structures 103 are coupled to the column and virtual ground decoders 105 for use in programming and reading the array.

FIG. 2 illustrates one embodiment of a flash memory array which might be used with the system of FIG. 1. FIG. 2 shows two pairs of columns of the array, where each pair of columns includes flash cells in a drain-source-drain configuration.

Thus, the first pair 120 of columns includes a first drain diffusion line 121, a source diffusion line 122, and a second drain diffusion line 123. Wordlines WL0 through WL63 each overlay the floating gates of a cell in a first one of the pairs of columns and a cell in the second one of the pairs of columns. As shown in the figure, a first pair 120 of columns includes one column including cell 124, cell 125, cell 126, and cell 127. Not shown are cells coupled to wordlines WL2 through WL61. The second one of the pair 120 of columns includes cell 128, cell 129, cell 130, and cell 131. Along the same column of the array, a second pair 135 of columns is shown. It has a similar architecture to the pair 120 of columns except that it is laid out in a mirror image.

Thus, as can be seen, the transistor in the first one of the pair of columns, such as the cell 125, includes a drain in drain diffusion line 121, and a source in the source diffusion line 122. A floating gate overlays the channel region between the first drain diffusion line 121 and the source diffusion line 122. The wordline WL1 overlays the floating gate of the cell 125 to establish a flash cell.

The column pair 120 and column pair 135 share an array virtual ground diffusion 136 (ARVSS). Thus, the source diffusion line 122 of column pair 120 is coupled to the ground diffusion 136. Similarly, the source diffusion line 137 of column pair 135 is coupled to the ground diffusion 136.

As mentioned above, each pair 120 of columns of cells shares a single metal line. Thus, a block right select transistor 138 and a block left select transistor 139 are included. The transistor 139 includes a source in the drain diffusion line 121, a drain coupled to a metal contact 140, and a gate coupled to the control signal BLTR1 on line 141. Similarly, the right select transistor 138 includes a source in the drain diffusion line 123, a drain coupled to the metal contact 140, and a gate coupled to the control signal BLTR0 on line 142. Thus, the select circuitry, including transistors 138 and 139, provides for selective connection of the first drain diffusion line 121 and a second drain diffusion line 123 to the metal line 143 (MTBL0) through metal contact 140. As can be seen, column pair 135 includes left select transistor 144 and right select transistor 145 which are similarly connected to a metal contact 146. Contact 146 is coupled to the same metal line 143 as is contact 140 which is coupled to column pair 120. The metal line can be shared by more than two columns of cells with additional select circuitry.

Column pairs are laid out horizontally and vertically to provide an array of flash cells comprising M wordlines and 2N columns. The array requires only N metal bit lines each of which is coupled to a pair of columns of flash cells through select circuitry, as described above.

Although the figure only shows four sub-blocks 120, 135, 150, and 151, coupled to two metal bit lines 143 and 152 (MTBL0–MTBL1), the array may be repeated horizontally and vertically as required to establish a large scale flash memory array. Thus, column pairs 120 and 150 which share a wordline are repeated horizontally to provide a sector of the array.

Of course, the array architecture illustrated in FIG. 2 is one example of the kinds of non-volatile memory architectures with which the present invention may be used. A variety of other architectures are also suited to segmented erase operations, and would benefit from the present invention.

Figures 3, 4:
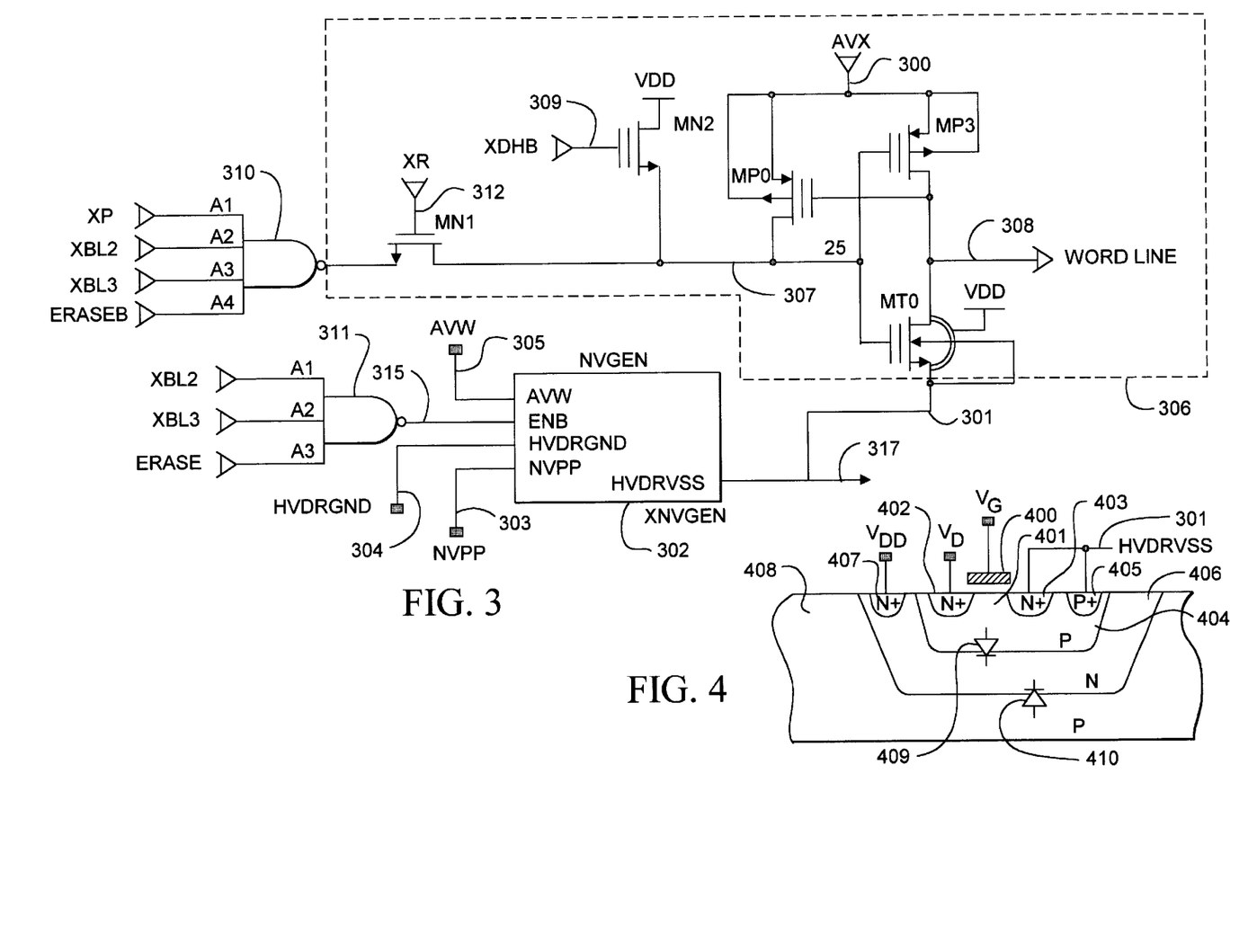
FIG. 3 is a schematic diagram of a wordline driver according to the present invention.
FIG. 4 illustrates isolated n-channel transistor which is used in the driver of FIG. 3.

FIG. 3 illustrates a preferred embodiment of the wordline driver according to the present invention. The wordline driver includes a first supply voltage source (such as positive voltage generator 109 of FIG. 1) which is connected to the AVX terminal 300. Also a second supply voltage source is coupled to terminal 301, which supplies a high voltage driver $V_{SS}$ voltage HVDRVSS. The second supply voltage source includes a supply voltage selector 302 which selects a negative voltage NVPP from terminal 303 or an inhibit supply voltage HVDRGND on terminal 304 as output in response to a supply select signal on line 315. In a preferred system, the value of NVPP is about −8 volts, and typically falls within the range of −5 to −10 volts. The value of HVDRGND is preferably about ground potential or 0 volts, and typically falls within the range of about −3 volts to +3 volts.

A positive supply voltage AVW is applied on line 305 to the selector 302. This positive supply voltage AVW (same as AVX during erase mode, about 3 volts) is controlled as discussed below during operation of the selector 302. The voltage HVDRVSS on line 301 is shared among a plurality of driver circuits 306, as indicated by the arrow 317.

The core driver circuit 306 includes an inverter composed of transistors MP3 and MT0 having their gates coupled to an input at node 307, and their drains coupled to a wordline or a set of wordlines 308. The driver circuit 306 also includes feedback which is provided by p-channel transistor MP0 which has its gate coupled to the output 308, its drain coupled to the input 307, and its source coupled to the supply terminal 300. The n-wells of the p-channel transistors MP0 and MP3 are both coupled to the AVX supply terminal 300.

The n-channel transistor MT0 consists of a triple well transistor implemented as shown in FIG. 4. This structure will be described below. The deep n-well is biased at the supply potential $V_{DD}$ which is typically 5 volts±10% and serves to isolate the n-channel transistor from the p-type substrate during negative voltage operations. In some embodiments, the supply voltage $V_{DD}$ is lesser or greater as suits a particular implementation. The driver circuit 306 also includes a "keeper" transistor MN2 which consists of a n-channel transistor having its source coupled to the input 307 its drain coupled to the supply terminal $V_{DD}$, and its input coupled to a control signal XDHB on line 309. This control signal XDHB on line 309 is controlled during negative voltage operations as discussed below.

Also, an n-channel transistor MN1 is connected in a pass-gate configuration between the input 307 and further decode logic represented by NAND gate 310. The n-channel transistor MN1 has its gate coupled to the signal XR on line 312 which is supplied by the wordline decoding logic. The source of transistor MN1 is connected to the output of the NAND gate 310. The inputs to the NAND gate include the signals XP, XBL2, and XBL3 derived from address signals. These signals in combination with the decode signal XR on line 312 serve to identify the particular driver circuit 306. Another input to the NAND gate 310 comprises a mode signal ERASEB which is low during the erase mode. Thus, during the erase mode, the signals derived from the address signals are overridden and the input on line 307 of the wordline circuit 306 is driven to a logic 1 value when XR is high.

Thus, the input on line 307 is driven in response to address signals identifying a particular driver during the read and program modes. However, the address signals are overridden during the erase mode and the driver circuit 306 receives a logic 1 value for all wordlines in a set of wordlines coupled to this decoding system. The signal XR is high on all drivers, in this example. On the other hand, the supply select signal on line 315 at the input to supply voltage sector 302 is driven by the NAND gate 311. The inputs to the NAND gate 311 include the signals XBL2 and XBL3 derived from the address signals, and the erase mode signal ERASE. During the erase mode, the signal ERASE is high enabling the output of the NAND gate 311 to be controlled by the address signals XBL2 and XBL3 which identify a particular segment of the array. These signals XBL2 and XBL3 are the same signals XBL2 and XBL3 which are applied to the input of NAND gate 310 which drives each of the wordline driver circuits 306 in the segment being selected.

In another alternative logic design, the NAND gate 310 is simplified to a 3 input NAND gate, removing the control signal ERASEB as input. The signal XR is controlled in response to ERASEB or its equivalent to disconnect the drivers from the gate 310, while XDHB is driven to a level that applies a logic one to node 307 without driving node 307 to a level exceeding AVX during erase mode.

Accordingly, the wordline driver operates during the read and program mode to apply a positive voltage from the supply AVX, or ground as a result of the specific wordline circuit 306 being activated by the wordline decoding system. During erase, a negative voltage or ground is applied to the wordline through the triple well n-channel transistor MN0. The operation conditions of the wordline driver circuit 306 are shown in Table 1 which follows:

| Operation Mode | XDHB | HVDRVSS | AVX |
| --- | --- | --- | --- |
| READ | VDD | 0 v | Vcc |
| Programming | VDD | 0 v | 12 v |
| Programming Inhibit of Row | VDD | 0 v | 12 v |
| Erase of blocks | VDD-->0 v | -8 v | 3 v |
| Erase Inhibit of blocks | VDD-->0 v | 0 v | 3 v |

U.S. Pat. No. 5,463,586 is incorporated by reference as if fully set forth herein, for the description of a suitable supply voltage selector for the positive voltage AVX. A wide variety of implementations of such supply voltage selector are suitable for utilization according to the present invention.

During the erase mode, the control signal XDHB is switched from $V_{DD}$ to 0 volts in order to break the connection between the terminal AVX on line 300 and the supply voltage $V_{DD}$. Alternatively, XDHB is driven to a level that prevents node 307 from exceeding AVX, as mentioned above.

It will be appreciated that wordline driver circuits 306 which have the same XBL2 and XBL3 but have different XP and XR share the same supply voltage selector 302. As a result, the wordline drivers in a segment of the floating gate memory array are switched to the negative voltage together.

A description of the triple well n-channel MOS transistor MT0 is illustrated in FIG. 4. The supply voltage selector 302 in a preferred embodiment is illustrated in FIG. 5, and the modified wordline decoding system according to the present invention is illustrated in FIG. 6.

The structure for a triple well n-channel transistor such as MT0 is illustrated in FIG. 4. In particular, the transistor is composed of a gate terminal 400 over a channel region 401 which is formed between n-type diffusion regions 402 and 403 operating as the drain and source, respectively, of the transistor. The n-type diffusion regions 402 and 403 are implemented in the isolated p-type well 404. The p-type well has a contact at point 405 which is connected to the HVDRVSS value on line 301.

The p-type well 404 is, in turn, formed in an n-type well 406, which has contact 407 to a positive supply voltage $V_{DD}$. The n-type well 406 is, in turn, formed in a p-type substrate 408. The structure establishes a p-n junction, schematically represented by the diode symbol 409 between the p-well 404 and the n-well 406. When negative voltages are applied to the p-well 404, this junction is reversed biased, isolating the n-well from the negative voltage. Similarly, a p-n junction represented by the diode symbol 410 is formed between the p-type substrate and the n-well 406. By biasing the n-well 406 with a positive voltage, this junction 410 is reversed biased, isolating the entire structure from the substrate.

Figure 5:
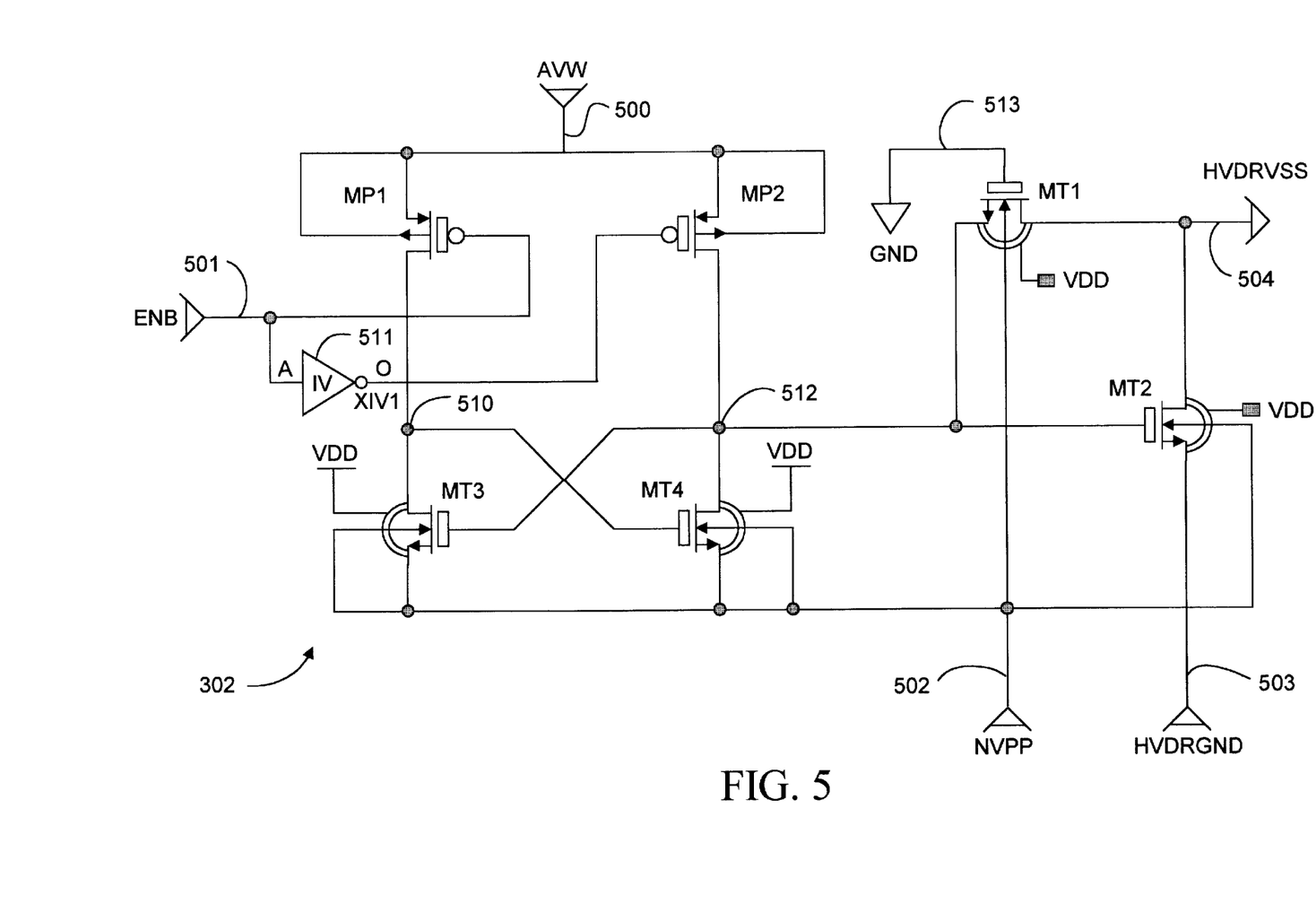
FIG. 5 illustrates a supply voltage selector for selecting between a negative voltage and a ground voltage or other inhibit level voltage.
Figure 6A:
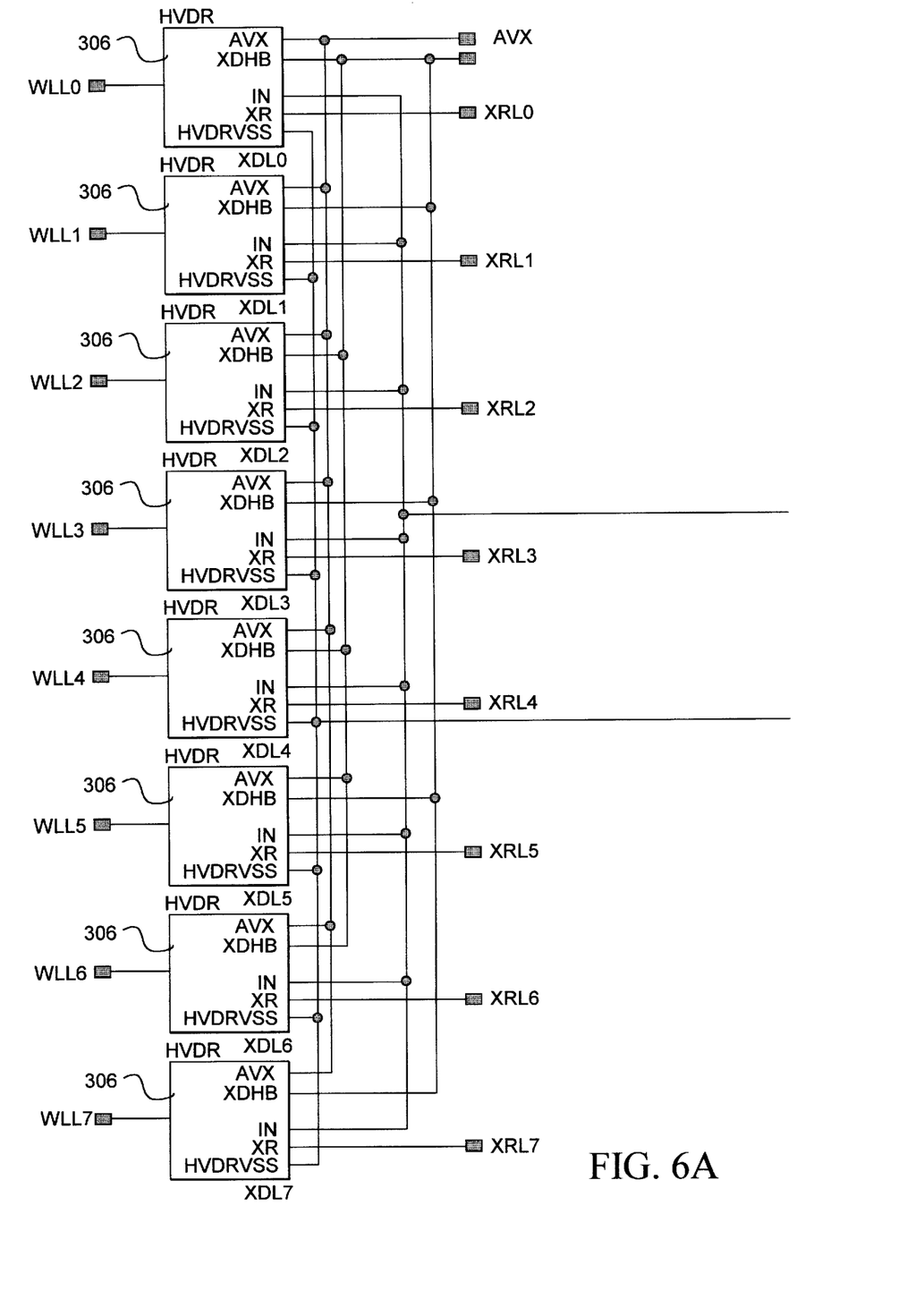
FIG. 6 made up of FIGS. 6A–6C illustrates a layout of the wordline decoding system according to the present invention.
Figure 6B:
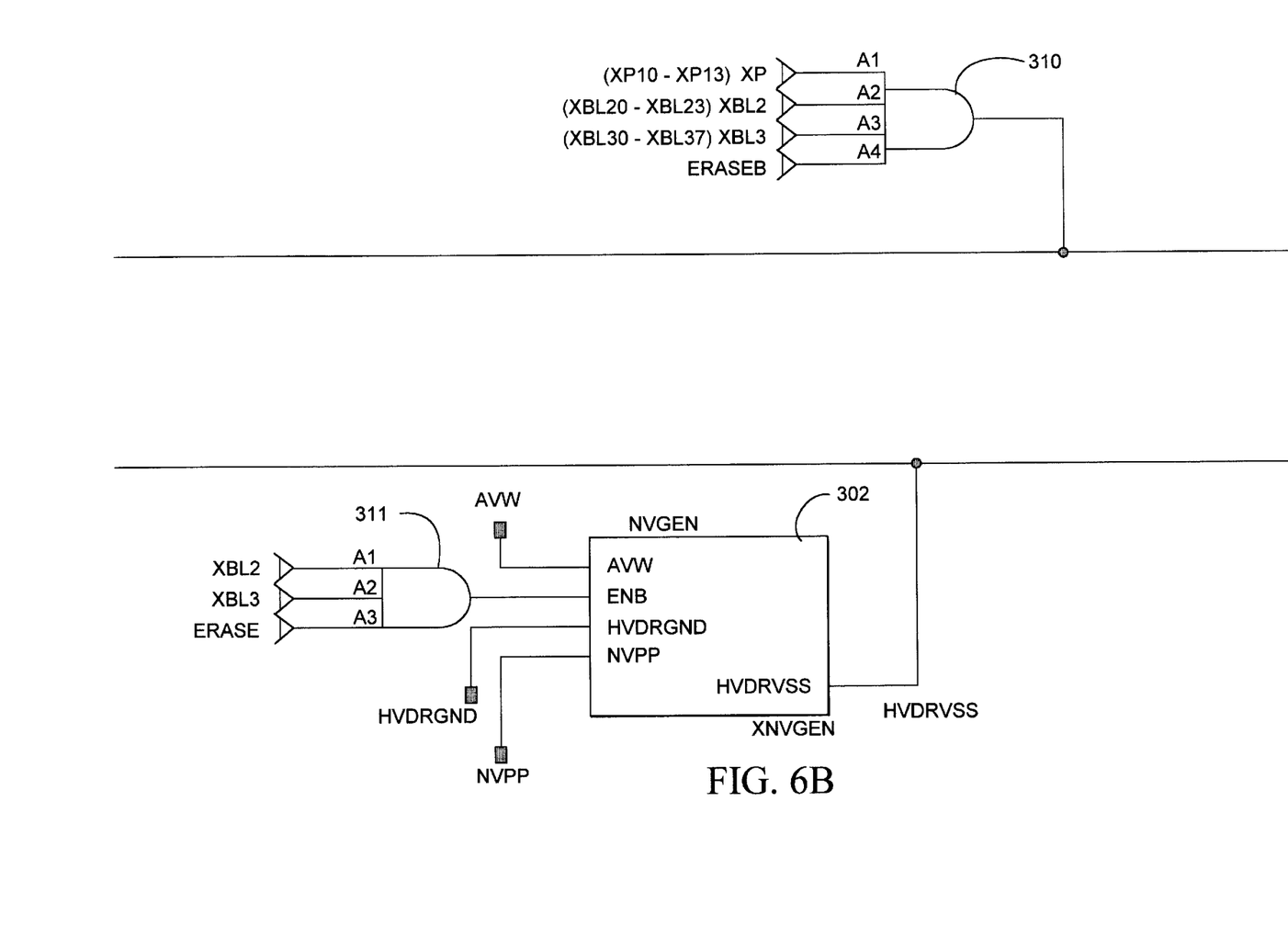
Figure 6C:
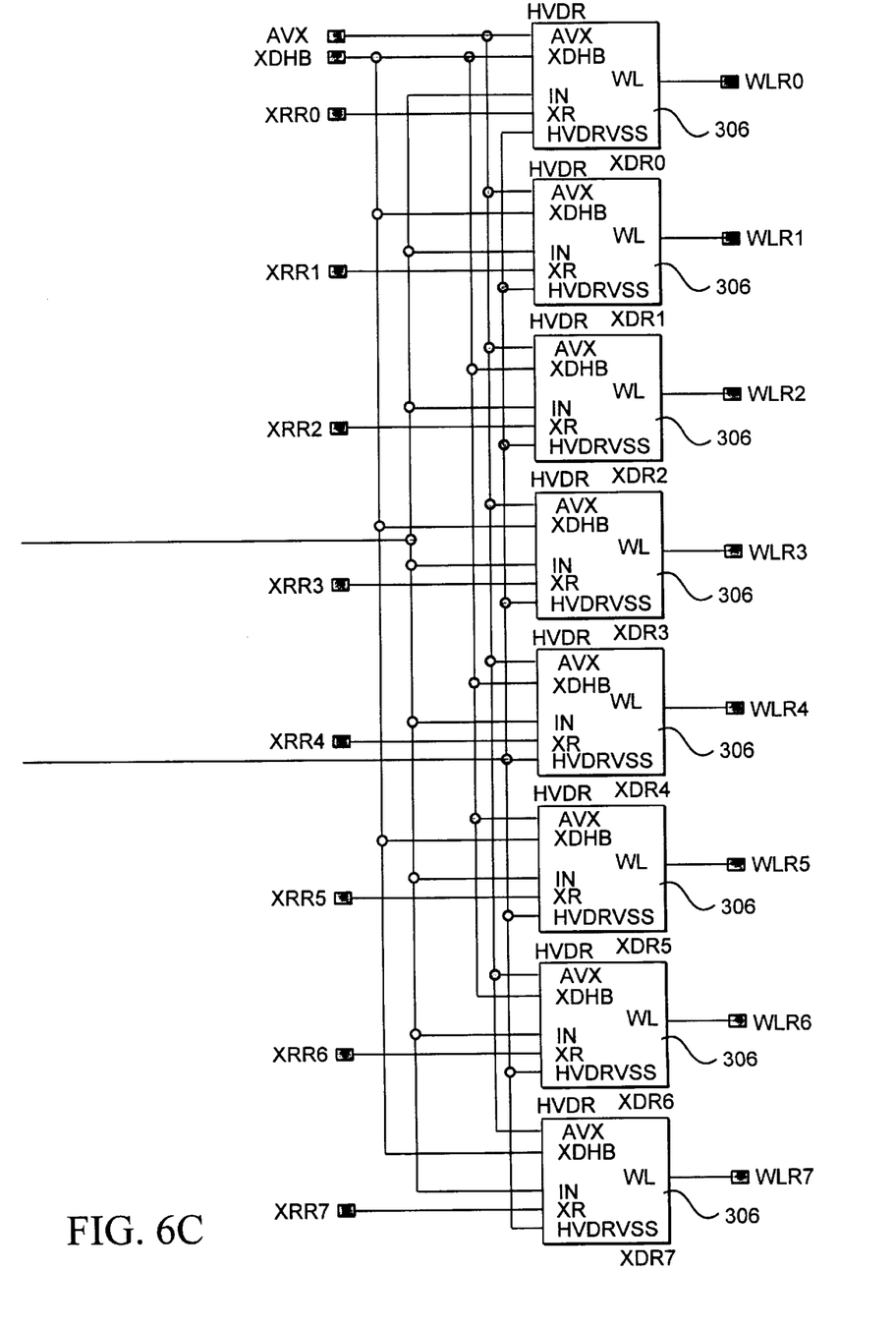

FIG. 5 illustrates the supply voltage selector 302 of FIG. 3 in one preferred embodiment. The supply voltage selector receives a supply input AVW on line 500, and selector signal ENB on line 501, a negative voltage NVPP on line 502, and a ground voltage HVDRGND on line 503. The circuit operates to select between the negative voltage 502 and the ground voltage 503 for supply on an output 504 which corresponds to the signal HVDRVSS on line 301 of FIG. 3. The supply selector includes p-channel MOS transistor MP1 which has its source and n-well coupled to the supply terminal 500, its gate coupled to line 501, and its drain coupled to node 510. P-channel MOS transistor MP2 has its source and n-well coupled to node 500, its gate connected to the output of an inverter 511 which has its input connected to node 501. The drain of transistor MP2 is connected to node 512. A triple well n-channel MOS transistor MT3 has its gate connected to node 512, its drain connected to node 510, its source and p-well connected to terminal 502 at which the negative voltage is applied. The deep n-well is coupled to the supply terminal $V_{DD}$. Triple well transistor MT4 has its drain coupled to node 512, its gate coupled to node 510, and its source coupled to node 502. Also, the p-well of transistor MT4 is also coupled to node 502. The deep n-well of transistor MT4 is coupled to the supply terminal $V_{DD}$.

Node 512 is coupled to the source of triple well transistor MT1 which has its gate coupled on line 513 to a ground potential and its drain coupled to the output node 504. The p-well of triple well transistor MT1 is coupled to node 502, while the deep n-well is coupled to the supply terminal $V_{DD}$. Triple well transistor MT2 has its gate coupled to node 512, its source coupled to the ground terminal 503, its p-well coupled to node 502, and its deep n-well coupled to the positive supply terminal $V_{DD}$. The drain of transistor MT2 is coupled to the output node 504.

In operation, as the select signal ENB on line 501 is low, node 512 is driven to the negative voltage NVPP via transistor MT4. This negative voltage, typically −8 volts, is thus applied to node 504 through transistor MT1 and transistor MT2 is turned off. Transistor MT2 serves to isolate the negative voltage at node 504 from the ground potential on node 503.

When the input signal ENB on line 501 is driven to the supply voltage $V_{DD}$, the node 512 is driven to the AVW value (typically 3 volts). The AVW value turns on transistor MT2, and causes transistor MT1 to turn off. This supplies the ground potential at line 503 to the output on node 504, while isolating the node 504 from the voltage at node 512.

FIG. 6 illustrates the wordline decoding system including the supply voltage selector of the present invention. The wordline decoding system of FIG. 6 corresponds to the decoding system for a segment of the array which drives 16 wordlines including wordlines WLL0–WLL7 on the left and wordlines WLR0–WLR7 on the right. Each of the wordlines is driven by a wordline driver circuit 306 as described in FIG. 3. The inputs to the wordline driver circuits 306 include the values AVX, XDHB. Also, each of the drivers 306 receives an input from the decoding system labeled in the system XRL0–XRL7 on the left, and XRR0–XRR7 on the right.

The input to each of the wordline circuits is supplied at the output of the NAND gate 310, which corresponds to the NAND gate of FIG. 3. The wordline circuits also receive the HVDRVSS signal the output of the wordline selector 302.

According to this embodiment, the XP signal is one of four XP signals (XP10–XP13) generated in response to the address signals. The XBL2 signal is one of four (XBK20–XBL23), and the XBL3 signals is one of eight (XBL30–XBL37). The XBL2 signal and XBL3 signal supplied at the input of NAND gate 311 are the same as those applied to the input of NAND gate 310 for a single segment of the array.

Accordingly, an efficient compact wordline driver circuitry supporting a segment erase operation for floating gate memory devices such as flash memory has been provided. The circuit reduces the layout and complexity required for negative voltage decoding, and overall reduces the cost of integrated circuits implementing this feature.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An integrated circuit memory, comprising:
   an array of memory cells arranged in a plurality of segments;
   a set of wordlines coupled to memory cells in the array;
   wordline driver circuitry coupled to the set of wordlines, including a first supply voltage source, a second supply voltage source, and a set of drivers, coupled to the first and second supply voltage sources, the drivers in the set of drivers selectively driving wordlines in the set of wordlines with a wordline voltage from the first supply voltage source or the second supply voltage source in response to address signals identifying the respective drivers;
   wherein the second supply voltage source includes a set of supply voltage selectors coupled with subsets of the set of drivers for respective segments of the array, which select a negative erase supply voltage or an erase inhibit supply voltage during an erase mode in response to address signals identifying the respective segments to the respective subsets of the set of drivers.

2. The integrated circuit memory of claim 1, wherein the wordline driver circuitry includes logic that causes the drivers in the set of drivers to select the second supply voltage source during the erase mode for all wordlines in the set of wordlines.

3. The integrated circuit memory of claim 2, wherein the wordline driver circuitry includes logic that overrides the address signals identifying the respective drivers during the erase mode.

4. The integrated circuit memory of claim 1, wherein the drivers in the set of drivers comprise
   an inverter, having an input driven in response to address signals identifying the driver, a first supply terminal coupled to the first supply voltage source, a second supply terminal coupled to the second supply voltage source, and an output coupled to a wordline in the set of wordlines; and
   a feedback circuit, coupled between the output and the input of the inverter.

5. The integrated circuit memory of claim 4, wherein the inverter comprises
   a p-channel MOS transistor in a substrate having a source coupled to the first supply terminal, a gate coupled to the input, and a drain coupled to the output of the driver;
   an n-channel MOS transistor in the substrate having a source coupled to the second supply terminal, a gate coupled to the input, and a drain coupled to the output of the driver, the n-channel MOS transistor having a p-type channel region in a deep n-type well biased for isolating the channel region from the substrate.

6. The integrated circuit memory of claim 5, wherein the feedback circuit comprises
   a p-channel MOS transistor in a substrate having a source coupled to the first supply terminal, a gate coupled to the output, and a drain coupled to the input of the driver.

7. The integrated circuit memory of claim 1, wherein the negative erase supply voltage has a value in the range of negative 5 to negative 10 volts.

8. The integrated circuit memory of claim 1, wherein the negative erase supply voltage has a value in the range of negative 5 to negative 10 volts, and the erase inhibit supply voltage has a value in the range of negative 3 to positive 3 volts.

9. The integrated circuit memory of claim 1, wherein the wordline driver circuitry includes segment decoder logic coupled to drivers in the set of drivers, the segment decoder logic having a read mode in which inputs to the drivers in the set are supplied in response to the address signals identifying the drivers and the supply voltage selector coupled with the segment selects a read supply voltage, and a segment erase mode in which inputs to the drivers in the subsets of the set of drivers for respective segments are supplied in response to an erase mode signal, and the supply voltage selectors coupled with the respective segments select the negative erase supply voltage or the erase inhibit supply voltage in response to address signals identifying the respective segments.

10. An integrated circuit memory, comprising:
an array of floating gate memory cells arranged in a plurality of segments;
control logic, coupled to the array, establishing a read mode, a program mode and an erase mode;
a set of wordlines coupled to memory cells in the array;
wordline driver circuitry coupled to the set of wordlines and the control logic, including a first supply voltage source, a second supply voltage source, and a set of drivers, coupled to the first and second supply voltage sources, the drivers in the set of drivers selectively driving wordlines in the set of wordlines with a wordline voltage from the first supply voltage source or the second supply voltage source in response to address signals identifying the respective drivers in the read mode and the program mode;
wherein the second supply voltage source includes a set of supply voltage selectors coupled with subsets of the set of drivers for respective segments of the array, which select a negative erase supply voltage or an erase inhibit supply voltage during the erase mode in response to address signals identifying the respective segments to the respective subsets of the set of drivers.

11. The integrated circuit memory of claim 10, wherein the wordline driver circuitry includes logic that causes the drivers in the set of drivers to select the second supply voltage source during the erase mode for all wordlines in the set of wordlines.

12. The integrated circuit memory of claim 11, wherein the wordline driver circuitry includes logic that overrides the address signals identifying the respective drivers during the erase mode.

13. The integrated circuit memory of claim 10, wherein the drivers in the set of drivers comprise
an inverter, having an input driven in response to address signals identifying the driver, a first supply terminal coupled to the first supply voltage source, a second supply terminal coupled to the second supply voltage source, and an output coupled to a wordline in the set of wordlines; and
a feedback circuit, coupled between the output and the input of the inverter.

14. The integrated circuit memory of claim 13, wherein the inverter comprises
a p-channel MOS transistor in a substrate having a source coupled to the first supply terminal, a gate coupled to the input, and a drain coupled to the output of the driver;
an n-channel MOS transistor in the substrate having a source coupled to the second supply terminal, a gate coupled to the input, and a drain coupled to the output of the driver, the n-channel MOS transistor having a p-type channel region in a deep n-type well biased for isolating the channel region from the substrate.

15. The integrated circuit memory of claim 14, wherein the feedback circuit comprises
a p-channel MOS transistor in a substrate having a source coupled to the first supply terminal, a gate coupled to the output, and a drain coupled to the input of the driver.

16. The integrated circuit memory of claim 10, wherein the negative erase supply voltage has a value in the range of negative 5 to negative 10 volts.

17. The integrated circuit memory of claim 10, wherein the negative erase supply voltage has a value in the range of negative 5 to negative 10 volts, and the erase inhibit supply voltage has a value in the range of negative 3 to positive 3 volts.

18. The integrated circuit memory of claim 10, wherein the wordline driver circuitry includes segment decoder logic coupled to drivers in the set of drivers, the segment decoder logic causing inputs to the drivers in the set to be supplied in response to the address signals identifying the drivers so that the drivers select a read supply voltage in the read mode, and causing inputs to the drivers in the subsets of the set of drivers for respective segments to be supplied independent of the address signals in the erase mode, and the supply voltage selectors coupled with the respective segments to select the negative erase supply voltage or the erase inhibit supply voltage in response to address signals identifying the respective segments in the erase mode.

19. A wordline driver in a set of wordline drivers, comprising:
a first supply voltage source, and a second supply voltage source, the second supply voltage source including a supply voltage selector which selects a negative voltage or an inhibit supply voltage as a second supply voltage in response to a supply select signal;
decode logic, responsive to address signals identifying the driver and a mode signal, to supply a decode logic output in response to the address signals when the mode signal is in a first state and without response to the address signals when the mode signal is in a second state;
supply select logic, responsive to address signals identifying a plurality of wordline drivers in the set of wordline drivers, to supply the supply select signal without response to the address signals when the mode signal is in the first state and in response to the address signals when the mode signal is in the second state;
an inverter, having an input connected to the decode logic output, a first supply terminal coupled to the first supply voltage source, a second supply terminal coupled to the second supply voltage source to receive the second supply voltage, and an output coupled to a wordline; and
a feedback circuit, coupled between the output and the input of the inverter.

20. The wordline driver of claim 19, wherein the inverter comprises
a p-channel MOS transistor in a substrate having a source coupled to the first supply terminal, a gate coupled to the input, and a drain coupled to the output of the driver;
an n-channel MOS transistor in the substrate having a source coupled to the second supply terminal, a gate coupled to the input, and a drain coupled to the output of the driver, the n-channel MOS transistor having a p-type channel region in a deep n-type well biased for isolating the channel region from the substrate.

21. The wordline driver of claim 20, wherein the feedback circuit comprises
a p-channel MOS transistor in a substrate having a source coupled to the first supply terminal, a gate coupled to the output, and a drain coupled to the input of the driver.

22. The wordline driver of claim 19, wherein the negative voltage has a value in the range of negative 5 to negative 10 volts.

23. The wordline driver of claim 19, wherein the negative voltage has a value in the range of negative 5 to negative 10 volts, and the inhibit supply voltage has a value in the range of negative 3 to positive 3 volts.

* * * * *